US006873927B2

(12) United States Patent
Chi et al.

(10) Patent No.: US 6,873,927 B2
(45) Date of Patent: Mar. 29, 2005

(54) CONTROL METHOD OF AN AUTOMATIC INTEGRATED CIRCUIT FULL TESTING SYSTEM

(75) Inventors: Ming-Ren Chi, Hsin-Tien (TW); Peng-Chia Kuo, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 33 days.

(21) Appl. No.: 10/368,096

(22) Filed: Feb. 18, 2003

(65) Prior Publication Data

US 2004/0024557 A1 Feb. 5, 2004

(30) Foreign Application Priority Data

Aug. 2, 2002 (TW) ........................................ 91117412 A

(51) Int. Cl.[7] .............................................. G06F 19/00
(52) U.S. Cl. ........................ 702/117; 702/121; 714/33; 714/43
(58) Field of Search ................................. 702/117, 121; 714/33, 43; 348/180, 189, 745, 807; 382/100, 145; 209/574; 324/158.1

(56) References Cited

U.S. PATENT DOCUMENTS 5,865,319 A * 2/1999 Okuda et al. ............... 209/574

6,442,712 B1 * 8/2002 Jeon ............................ 714/43

* cited by examiner

*Primary Examiner*—John Barlow
*Assistant Examiner*—Stephen J. Cherry
(74) *Attorney, Agent, or Firm*—J.C. Patents

(57) ABSTRACT

A control method for an automatic integrated circuit full testing system. A control device is utilized to control the testing process of the automatic integrated circuit full testing system. The steps for controlling the control device include driving an automatic transport device to fetch test integrated circuits from an integrated circuit supply rack to various testing computer stations. An automatic plug/unplug tool is driven so that each integrated circuit is plugged into the connector of a corresponding testing computer. All the testing computers are triggered to carry out respective preset testing programs. An image sensor is driven to monitor the an output image of the testing computers so that any abnormality in the integrated circuits can be determined. Thereafter, the automatic plug/unplug tool is driven to unload the tested integrated circuit from the testing computer. The automatic transport device is driven to transfer the tested integrated circuit to various integrated circuit bins of an integrated circuit binning device according to the testing results.

18 Claims, 4 Drawing Sheets

CONTROL METHOD OF AN AUTOMATIC INTEGRATED CIRCUIT FULL TESTING SYSTEM

CROSS-REFERENCE TO RELATED APPLICATION

This application claims the priority benefit of Taiwan application serial no. 91117412, filed Aug. 2, 2002.

BACKGROUND OF THE INVENTION

1. Field of Invention

The present invention relates to an automatic integrated circuit full testing system, apparatus and method. More particularly, the present invention relates to an automatic integrated circuit full testing system, apparatus and method capable of simulating end user's states and performing a dynamic test.

2. Description of Related Art

The rapid progress in computer technologies has brought major changes in our daily lives. Various computer-related products such as servers, workstations, desktop computers, portable computers, personal digital assistant, palm-top PCs, pocket PCs or industrial computers have become an inevitable portion of us in many ways. All these computer products comprise a system of assembled integrated circuits (ICs). Before selling these computer products to the customers, the integrated circuits contained in the computers must be thoroughly tested to ensure their quality.

FIG. 1 is a block diagram showing the schematic architecture of a conventional personal computer (PC). As shown in FIG. 1, major components included in a conventional personal computer 100 are a central processing unit (CPU) 110, a system bus controller 112 and an input/output bus controller 114. A memory unit 116 and an advanced graphic port 118 are electrically connected to the system bus controller 112. A monitor 120 is electrically connected to the advanced graphic port 118 for outputting images. A peripheral component interface (PCI) 122 is connected to the system bus controller 112 and the input/output bus controller 114. An integrated drive electronics (IDE) interface 130, a floppy disk 132, a parallel port 134, a serial port 136 and a universal serial bus (USB) 138 are all electrically connected to the input/output bus controller 114. In addition, an audio unit 140 and an Ethernet interface 142 may also be electrically connected to the input/output bus controller 114.

Each of the aforementioned component units comprises one or more integrated circuits. For example, the central processing unit 110, the system bus controller 112, the input/output bus controller 114, the memory unit 116, the graphic accelerator attached to the advanced graphic port 118, the audio chip as well as the Ethernet chip are all constructed using one or many integrated circuits. Since all these integrated circuits are important electronic elements inside the computer, the functionality of each and the compatibility among these integrated circuit are critical to the smooth operation and the performance of the entire computer system.

FIG. 2 is a flow chart showing the steps for testing an integrated circuit in a conventional method. An initial test of the conventional integrated circuit 202 such as a logic integrated circuit (logic IC) must be conducted at the end of wafer fabrication. After packaging the chip, a final test 204 is carried out before shipment 206. In the final test of an integrated circuit, the integrated circuit is placed inside an automatic test equipment (ATE) such that the contacts on the integrated circuit are electrically connected to the ATE through a test socket. Thereafter, a preset sequence of test steps is carried out to test the functionality thereof. At the end of the test, functionality of the integrated circuit is assessed. Functionality test of the integrated circuit is conventionally carried out using special programs. Furthermore, the final states at the end of the simulation are used to judge the quality of the integrated circuit. According to the test results, the integrated circuits are sorted out in a binning system before shipment.

After conducting a first stage final test 208, integrated circuits such a memory IC must further undergo a burn-in test 210 and a second stage final test 212 before shipment. Both the first stage final test 208 and the second stage final test 212 are carried out using the ATE. Yet, the burn-in test 210 is often performed manually or semi-automatically. The memory IC is plugged into the socket of a test circuit board and then the entire test circuit board with the memory IC is transferred into a heat-testing station that can control the test temperature. Inside the heat-testing station, the memory IC is thermally stressed, voltage stressed or current stressed to test the chip. However, this type of testing only tests the functional aspects of an integrated circuit using simulation programs. The test is not performed in the actual operating environment of an end user. Hence, there still could be an instable or incompatible problem occurred when the integrated circuit is assembled inside a computer after it passes the ATE tests.

FIG. 3 is a flow chart showing the steps in a conventional method of testing an integrated circuit through simulation. Since a conventional testing method does not provide an end-user environment simulation, a circuit module test of the integrated circuit may be conducted after the final test but before shipment. In a conventional module test, a module such as an interface or a test computer is provided. An integrated circuit 302 is manually inserted into the module or the test computer in step 304. The module or the test computer is capable of simulating the operating environment of an end user. Thereafter, the integrated circuit 302 is tested in step 306 and the qualified circuits are shipped in step 308. Because this portion of the testing is mostly carried out manually and quality assessment is also carried out visually, productivity is low and testing time is long. Moreover, quality problems always occur due to human errors, which leads to an increase in production cost and a decrease in testing reliability.

In brief, some of the deficiencies and drawbacks of a conventional testing method include:

1. Since actual test in an end-user environment is not provided, problems such as being compatible to software may still occur even though an integrated circuit has passed the conventional test.

2. The electronic devices are fixedly mounted on the test circuit board for testing an integrated circuit. Hence, compatibility of the same integrated circuit between different devices is untested.

3. The conventional method relies heavily on manual operations and hence severely limits overall throughput and increases the probability of having human errors.

4. The module test method is incapable of providing temperature control for the integrated circuit once the circuit is incorporated into the module. Hence, some of the actual working conditions are not simulated and tested.

5. The integrated circuit is assessed according to the final states and hence incapable of detecting any dynamic errors such as video shaking, discoloring display, ghost shadow or white block produced by a graphic accelerator. Possible conflicts when the integrated circuit executes a particular software program also remain undetected by the conventional testing method.

SUMMARY OF THE INVENTION

Accordingly, one object of the present invention is to provide an automatic integrated circuit full testing system, apparatus and method for testing an integrated circuit using a computer simulating end user's states so that quality of the integrated circuit in actual operation can be ensured.

A second object of this invention is to provide an automatic integrated circuit full testing system, apparatus and method having a plurality of integrated circuit connectors all linked to a testing computer so that compatibility between different integrated circuits is tested and any error states between the circuits are easily discovered.

A third object of this invention is to provide an automatic integrated circuit full testing system, apparatus and method such that all testing is conducted automatically rather than manually, thereby increasing productivity and accuracy and lowering production cost.

A fourth object of this invention is to provide an automatic integrated circuit full testing system, apparatus and method such that operating temperature of an integrated circuit connected to a testing computer can be controlled so that testing at more complicated testing conditions are provided.

A fifth object of this invention is to provide an automatic integrated circuit full testing system, apparatus and method that provides full automatic monitoring of the dynamic states of a test integrated circuit so that a more accurate assessment of the integrated circuit is obtained.

An sixth object of this invention is to provide an automatic integrated circuit full testing system, apparatus and method capable of testing the integrated circuit using different hardware components inside the testing computers or testing using different testing programs (different application programs), thereby fully assessing the compatibility between the tested integrated circuit and the hardware components and/or software programs.

To achieve these and other advantages and in accordance with the purpose of the invention, as embodied and broadly described herein, the invention provides a method of performing an automatic integrated circuit full testing system. The testing flow of the automatic integrated circuit full testing system is controlled through a control device. The control device carries out the following steps. First, an automatic transport device is driven to fetch the integrated circuits to be tested from an integrated circuit supply rack to various testing computer stations. An automatic plug/unplug tool is driven to plug each integrated circuit into the connector of a corresponding test computer. All the testing computers are triggered to carry out respective preset testing programs. An image sensor and/or an audio sensor are driven to monitor the image output of the execution states of the testing computers so that any abnormality in the integrated circuits can be determined. Thereafter, the automatic plug/unplug tool is driven to unload the tested integrated circuit from the testing computer. The automatic transport device is driven to transfer the tested integrated circuits to various integrated circuit bins according to the test results.

According to the aforementioned method of operation, this invention also provides an automatic integrated circuit full testing system and apparatus that includes a system frame and one or more sets of testing computers with each testing computer capable of receiving and testing an integrated circuit. The testing system also includes an automatic plug/unplug tool for engaging an integrated circuit with the testing computer so that the integrated circuit and the testing computer are electrically connected to form a system-completed computer so as to perform a system-level test. The testing system also includes an image sensor for monitoring the operating states of the testing computer. The automatic integrated circuit full testing system may also be applied to mass testing of integrated circuits. To facilitate the transfer and sorting of integrated circuits during mass testing, an automatic transport device, an integrated circuit supply rack and an integrated circuit binning device may also be introduced into the testing system.

The connectors of the testing computer may mount on a host board or an interface module so that different types of integrated circuits can be tested. Furthermore, a temperature control device may be added to the automatic integrated circuit full testing system for controlling the operating temperature of the test integrated circuit so that a thermal stress test of the integrated circuit is possible. The image sensor is a detector such as a charge-coupled device capable of monitoring an output image of the output device such as a monitor or a printer of the testing computer.

Because the testing method according to this invention is carried out at a system-level through a system-completed computer, general-purpose or specific programs can be executed. Hence, the method not only permits a simulation of end-uses states, but also permits the execution of an actual application software program such as a window operating system so that quality of the integrated circuit can be fully assessed.

In addition, this invention also provides a plurality of connectors for connecting a plurality of integrated circuits with a testing computer. Thus, devices such as central processing unit, system bus controller, input/output bus controller and graphic accelerator may be plugged into a corresponding connector and linked to the testing computer. With this arrangement, compatibility between different types of integrated circuits can be assessed and any error states between them can be found with ease.

Through the automatic transport device, the integrated circuit supply rack, the integrated circuit binning device and the image sensor, system-level testing becomes fully automatic. Since manual labor is excluded, productivity and testing correctness is increased while production cost is lowered.

This invention also provides a temperature control device for adjusting the temperature of the integrated circuit when carrying out a system-level test.

In addition, the image sensor within the testing system is capable of monitoring the dynamic states of the operating integrated circuit so that functionality of the integrated circuit is accurately gauged.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
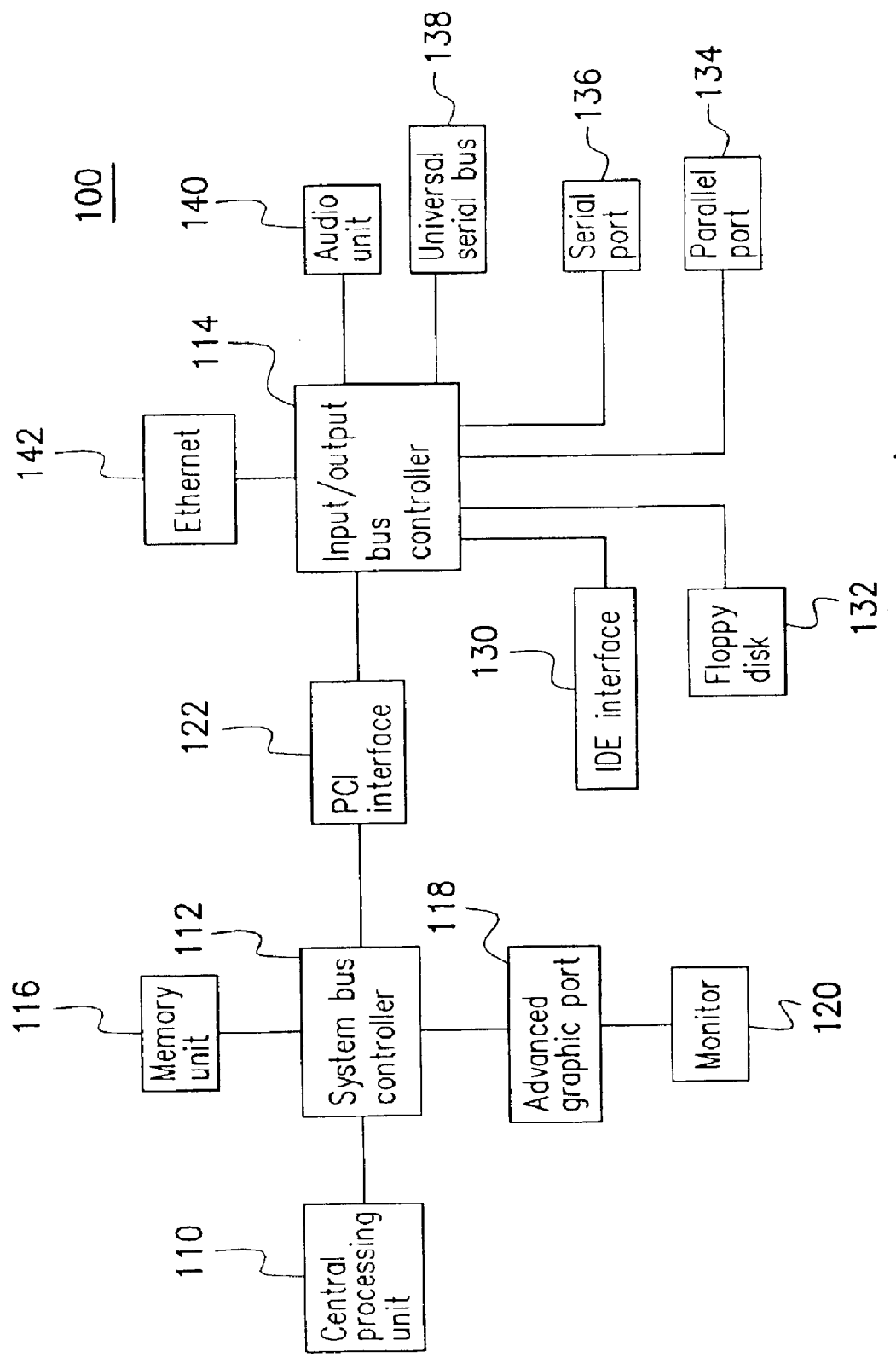
FIG. 1 is a block diagram showing the schematic architecture of a conventional personal computer.
Figure 2:
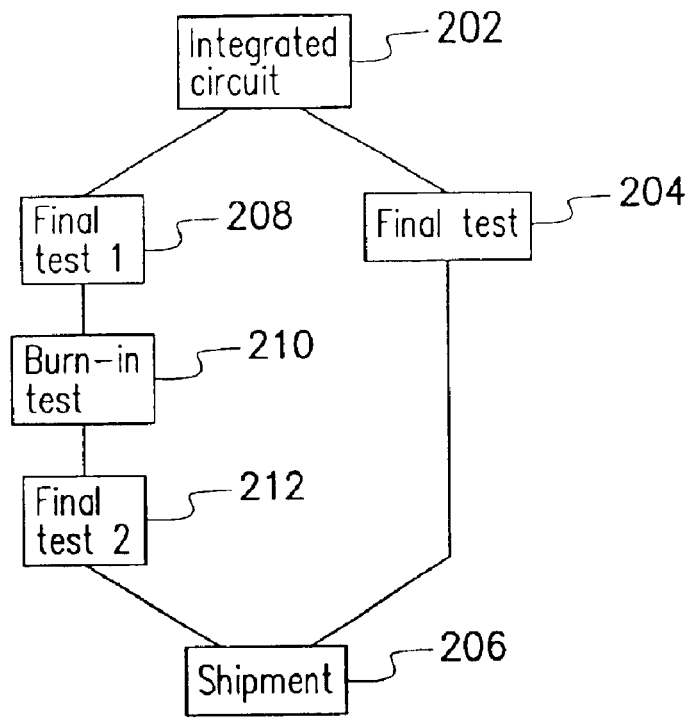
FIG. 2 is a flow chart showing the steps for testing an integrated circuit in a conventional method.
Figure 3:
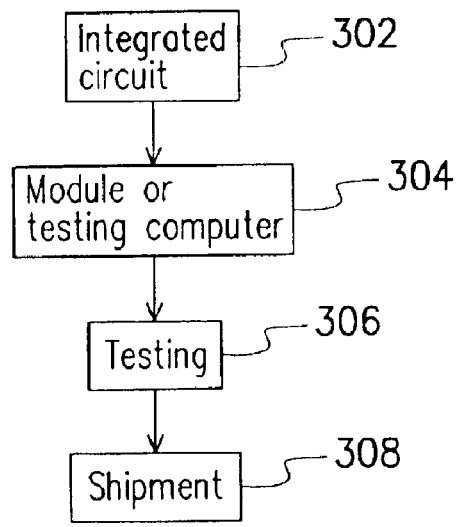
FIG. 3 is a flow chart showing the steps in a conventional method for testing an integrated circuit module.

Reference will now be made in detail to the present preferred embodiments of the invention, examples of which are illustrated in the accompanying drawings. Wherever possible, the same reference numbers are used in the drawings and the description to refer to the same or like parts.

The automatic integrated circuit full testing system, apparatus and method relies on a known good computer to test an integrated circuit connected to a testing computer. For a personal computer, the integrated circuits that can be tested include, for example, central processing units, system bus controller, input/output bus controller or the integrated circuit inside an interface module such as a graphic accelerator. In general, the integrated circuits such as central processing unit, system bus controller and input/output bus controller are mounted on a main circuit board. Central processing units connect electrically with the main board through a connector such as socket 478, socket 423, socket 370 or socket 7. Memory circuits are mounted on a module board and the module board is then electrically connected to the main board through a connector such as DIMM or RIMM. System bus controllers and input/output bus controllers connect electrically with the main board through surface mount technology (SMT). Graphic accelerators may connect with the main board using surface mount technology or being mounted on a module board so that the graphic accelerator connects with the main board through an advanced graphic port. Integrated circuits of peripheral devices are attached to a module board. The module board is plugged to a PCI slot so that the integrated circuits and the main board are electrically connected together. In addition, other devices such as audio chip and Ethernet chip may directly attach to the main board or may first attach to a module board and the module board can be electrically connected to the main board through a PCI slot or other interface. Obviously, the automatic system-level test system is not limited to the testing of a personal computer system. The automatic system-level test apparatus is also applicable to the testing of other computer equipment such as servers, workstations, desktop computers, notebook computers, portable computers, personal digital assistants, palm-top computers, pocket computers or even the integrated circuits inside an industrial computer.

To simulate the states of an end user, all the specifications of the testing computer is identical to an actual circuit board (main board or module board) used by an end user. In a common computer, some integrated circuits are permanently fixed to the circuit board by soldering while other circuits are plugged to connectors on the circuit board. However, in this invention, since the integrated circuits to be tested are connected to the testing computer just for testing, a connector is always provided for each integrated circuit to received the integrated circuit. The connector may be a specially designed connector for connecting with an integrated circuit which is normally fixed onto a circuit board by soldering in a common computer. Even for those integrated circuits that usually connect to the main board or module board through a connector, a specially designed connector may still be provided to facilitate the testing process. Of course, the original connector may be used for testing if the connector fits the testing purposes. These integrated circuit connectors may be positioned on the main board or on the circuit board on an interface module. Moreover, the same circuit board may accommodate a plurality of integrated circuit connectors for testing various types of integrated circuits. For example, a system-completed computer may include two different types of connectors for engaging with two different types of integrated circuits A and B. In a first case scenario, the integrated circuit inserted into the connector A is the one to be tested. In this case, the known good integrated circuits B1, B2, B3 can be plugged into the connector B for test one by one so that compatibility between the integrated circuit A and each of the integrated circuits B1, B2, B3 in the connector B can be checked. In a second case scenario, the integrated circuit plugged into the connector B is the one to be tested. In this case, a known good integrated circuit is plugged into the connector A so that the connector B becomes a connector for engaging testing circuits.

Figure 4:
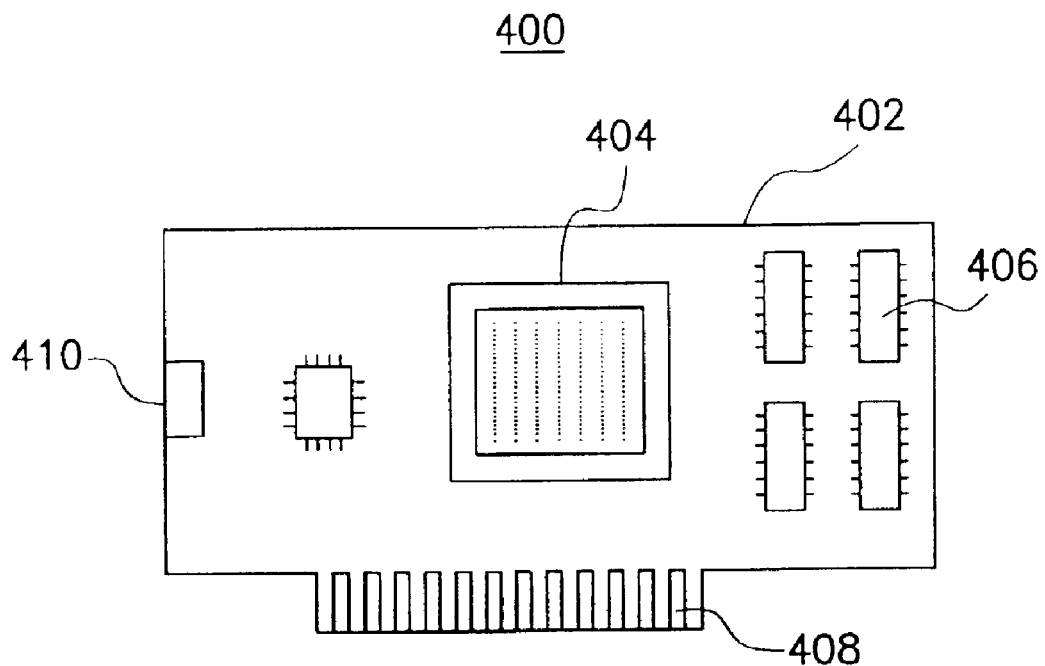
FIG. 4 is a schematic diagram showing one type of test interface module for testing according to one preferred embodiment of this invention.

FIG. 4 is a schematic diagram showing one type of test interface module according to one preferred embodiment of this invention. Using an advanced graphic interface module 400 (AGP module) as an example, if the graphic accelerator chips of the AGP module 400 need to be tested, a socket or connector 404 is set up on the module board 402 where the original graphic accelerator chip is located and attached thereto by soldering. Other components on the module board 402 such as video RAM 406, gold fingers 408 for plugging into an AGP slot or monitor socket 410 are set up according to the standard specification.

Figure 5:
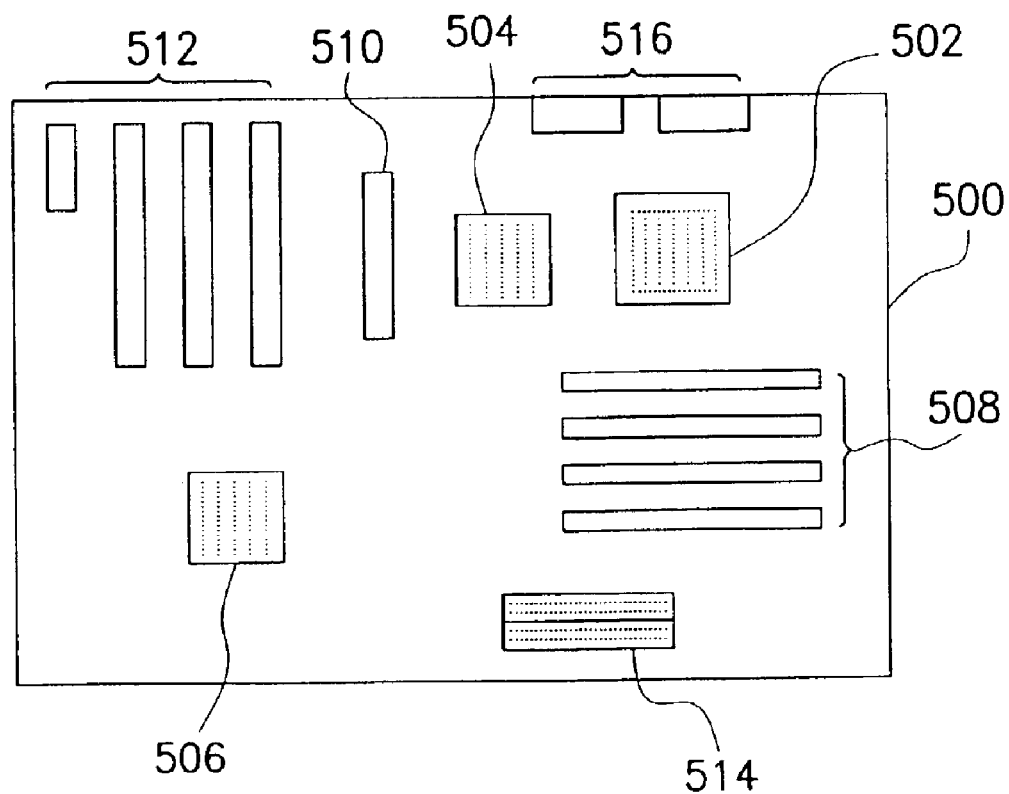
FIG. 5 is a schematic diagram showing one type of main board for testing according to one preferred embodiment of this invention.

FIG. 5 is a schematic diagram showing one type of main board according to one preferred embodiment of this invention. As shown in FIG. 5, a typical main board 500 has a number of integrated circuits. Major integrated circuits include a central processing unit (CPU), system bus controller and input/output bus controller so that integrated circuit testing may be designed for these integrated circuits. Hence, the main board 500 may include sockets such as a central processing unit (CPU) socket 502, a system bus controller socket 504 and an input/output bus controller socket 506. Other connectors on the main board 500 such as DRAM slot 508, advanced graphic port (AGP) slot 510, expansion slot 512 (including peripheral component interface (PCI) slot, CNR slot and so on), integrated drive electronics (IDE) port and input/output (I/O) port 516 (including parallel port and serial port) are designed according to standard specification.

The aforementioned sockets or connectors may be designed to fit a particular integrated circuit package design. Hence, packages such as ball grid array packages (including BGA, PBGA, EBGA and so on), pin grid array packages (including PGA, CPGA, PPGA and so on) and small outline packages (SOJ) may be plugged into the main board 500 to carry out a system-level test.

Figure 6:
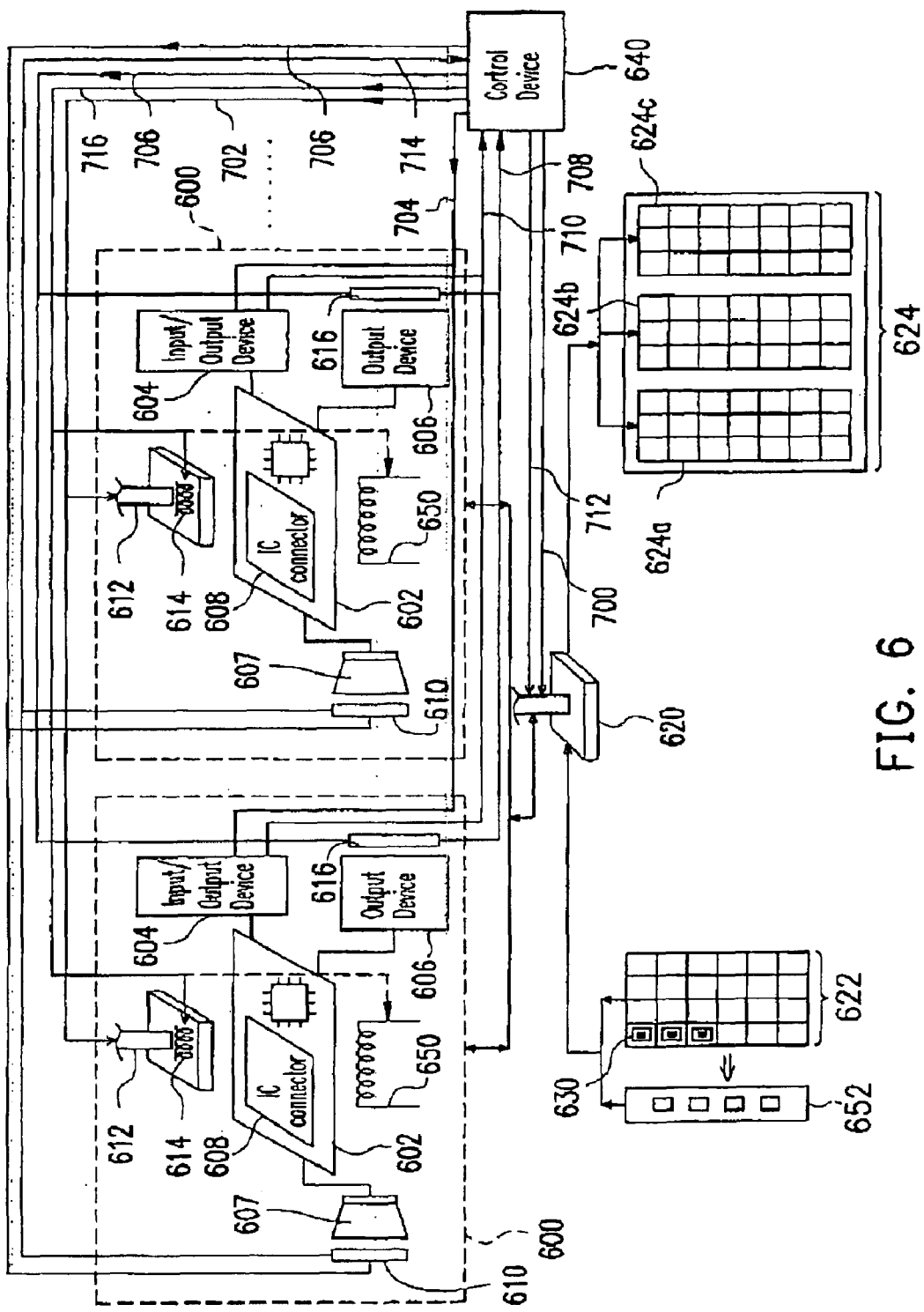
FIG. 6 is a schematic diagram showing the architecture of an automatic integrated circuit full testing system according to one preferred embodiment of this invention.

FIG. 6 is a schematic diagram showing the architecture of an automatic integrated circuit full testing system according to one preferred embodiment of this invention. Testing of the integrated circuits is performed through a known good testing computers 600. The testing computer 600 includes at least a main host section 602, an input/output device 604 and an output device 606. The main host section 602 includes at least one integrated circuit connector 608 for accommodating an integrated circuit to be tested. The main host section 602 may just include a main board capable of accommodating a selection of interface modules. The integrated circuit connector 608 is either positioned on the interface module as shown in FIG. 4 or positioned on the main board as shown in FIG. 5. A plurality of integrated circuit connectors may be installed on the main host section 602. The input/output device 604 includes a data storage device such as magnetic disk drive for holding various software programs including the ones that subsequently drive the testing computer 600. The software programs may include specially designed testing programs and some common and important application programs. The output device 606 can be a monitor for displaying output such as a cathode ray tube (CRT) or a liquid crystal display (LCD). Obviously, other types of output display devices such as a printer may also be used. In addition, the output device 606 may even be a loudspeaker 607. If necessary, audio output devices may be monitored through an audio sensor 610 so that compatibility between different integrated circuits can be assessed. The testing computer 600 may further include many peripheral devices 610 such as keyboard, mouse, plotting machine, scanner, magnetic disk drive, compact disk drive and digital camera. The peripheral devices 610 may be selected according to the list of items that are used in the testing. The selection may also be made so as to assess the compatibility between a particular integrated circuit and a selection of peripheral devices.

The testing computer 600 carries at least one integrated circuit that requires testing. The testing computer 600 can be any one of the aforementioned types of computers. In an ideal arrangement, the assembling method of all the integrated circuits inside the testing computer 600 is identical to an end user's hardware environment so that any testing is equivalent to an actual operation in the physical environment. In another preferred embodiment, aside from the connector for engaging with a test integrated circuit, all the other major integrated circuits on the main host section 602 are installed identically to the system received by the end user. Hence, the setup is capable of simulating actual operations in an end-user's environment so that the test results are very accurate. In yet another embodiment, some of the non-testing know good integrated circuits are engaged to the circuit board through connectors so that these integrated circuits may be plugged or unplugged. With this arrangement, identical test integrated circuits may be tested together with a variety of non-testing know good circuits so that compatibility of the tested integrated circuit with other types of integrated circuits may be discovered using the same circuit board. In another embodiment, the same main host section 602 may include a plurality of connectors for testing. If one of the connectors is used for testing, the other connectors are connected to known good integrated circuits. Since a system-completed computer is formed when a to-be-tested integrated circuit is plugged into the testing computer, this type of computer is referred to as a system-completed computer in this invention, and the test conducted with such a system-completed testing computer is called a system level test for an integrated circuit. Obviously, all the components in the system-completed computer including other electronic devices on the circuit board or peripheral devices connected to the testing computer may be identical to the one used by an end user. Because the system-completed computer is a complete computer that includes all hardware necessary to run as a common computer, various types of testing programs can be executed through the system-completed testing computer to simulate all possible end-user states. This includes general application programs such as a windows system, video, games and special programs such as the computer numerical control code of an industrial computer or CAD/CAM software in a workstation. Furthermore, the system-complete computer may also serve as a workstation and execute a special program to test a computer numerical control machine by carrying out some mechanical operations.

The test integrated circuit is plugged into the integrated circuit connector 608 using the automatic plug/unplug tool 612 such as a robotic arm so that the test integrated circuit and the testing computer 600 are electrically connected to form a system-completed testing computer. The automatic plug/unplug tool 612 may have a temperature control device 614 that includes a heater and/or a cooler for setting the operating temperature of the integrated circuit and hence providing the necessary thermal stress or simulating the cooling of an actual fan or a heat dissipater, or a low temperature ambient. The testing computer 600 is driven by a preset testing program such as a window operating system or a stereo image playback program stored inside the input/output device 604. The output device 606 is capable of outputting the execution states of the testing computer 600. The integrated circuit testing device uses the image sensor 616 to detect images produced by the output device 606 and hence determines if the integrated circuit operates normally with the testing computer 600. The image sensor 616 can be a charge-coupled device (CCD) or a CMOS image sensor (CIS), for example. The image sensor 616 performs an instant dynamic monitoring of the output image of the testing computer 600 and determines if the integrated circuit is operating normally. The automatic transport device 620 is, for example, a robotic arm for transporting the integrated circuits. The automatic transport device 620 is capable of moving a test integrated circuit 630 from an integrated circuit supply rack 622 (such as a towed pellet plate) to the testing computer 600 for the testing. The automatic transport device 620 also carries the tested integrated circuit from the integrated circuit binning device 624 according to the test results. The integrated circuit binning device 624 includes a plurality of storage bins 624a, 624b and 624c for putting various tested integrated circuits. For example, the storage bin 624a holds integrated circuits that pass all the tests, the storage bin 624b holds the integrated circuits that fail the test entirely and the storage bin 624c holds the integrated circuits that pass some of the tests.

The control unit 640 connects with the testing computer 600, the image sensor 616 and the automatic plug/unplug tool 612 for monitoring the execution states of the testing computer 600 (such as via the input/output device 604) and the image sensor 616. The control unit 640 determines if the integrated circuit 630 operates normally with the testing computer 600, and at the same time, controls the operation of the automatic transport device 620. In other words, the control unit 640 monitors and oversees the entire testing flow of the testing system. Note that the functions of the automatic transport apparatus 620 and the automatic plug/unplug tool 612 may be combined together by using a single robotic arm that can perform the functions of both the automatic transport apparatus 620 and the automatic plug/unplug tool 612. In this situation, the temperature control device 614 is installed on the single robotic arm. In addition, aside from installing the temperature control device on the automatic plug/unplug tool 612, another temperature control device may be installed on the testing computer 600 (such as 650). In the alternative, before sending the test integrated circuit 630 to the testing computer 600 using the automatic transport device 620, the integrated circuit 630 is first transferred to a temperature-presetting region 652 and preheated to an operating temperature to be simulated. Preferably, the preheating operation is performed with the aid of the temperature control device 614 on the automatic plug/unplug tool 612 so that temperature of the preheated integrated circuits can be maintained in transportation.

The automatic integrated circuit full testing system in this invention is mainly controlled by the control device 640. The control device 640 is preferably a computer that controls the entire test flow in the testing system. The operations that can be controlled by the control device 640 may include the operations of the automatic transport device 620, the automatic plug/unplug tool 612, the testing computer 600, the temperature control devices 614, 650 and/or the preheating region 652, the image sensor 616, the audio sensor 610 and the reception of data. Through the received instant image data of the image output device and the system-completed computer test results, the test results can be analyzed to determine if the integrated circuit is normal. In an alternative arrangement, the control device 640 controls only the testing operation leaving the test results to be determined by the testing programs. Furthermore, the control device 640 may be controlled by a remote control signal through network according to a user's settings. In other words, the testing system is able to respond to a remote control signal so that the user may monitor and control the testing at any time from anywhere.

The method of controlling the automatic integrated circuit full testing system according to this invention includes the following steps. First, the control device 640 issues a first signal 700 to the automatic transport device 620 so that an integrated circuit 630 is fetched from the automatic integrated circuit supply rack 622 and transported to various testing computers 600. The control device 640 issues a second signal 702 to the automatic plug/unplug tool 612 so that the integrated circuit is plugged into the testing computer 600 and connected electrically with the testing computer 600 through the connector 608 to form a system-completed computer. Thereafter, the control device 640 issues a third signal 704 to the system-completed computer through the input/output device 604 and triggers the system-completed computer to carry out a preset testing program. The testing computer 600 feeds back result signals to control device 640 through the input/output device 604. In the meantime, the control device 640 also issues a fourth signal 706 to drive the image sensor 616 for detecting the operation image of the system-completed computer and receives back an output image 708 shown on the image output device 606. The control device 640 analyzes the test results 710 of the system-completed computer and the output image 708 and determines if the integrated circuit 630 passes the test. The control device 640 issues a fifth signal (through a signal line identical to the one sending the second signal 702) to drive the automatic plug/unplug tool so that the integrated circuit 630 is removed from the system-completed testing computer. Thereafter, the control device 640 issues a sixth signal 712 to drive the automatic transport device 620 so that the tested integrated circuit 630 is transferred to the integrated circuit binning device 624. According to the test results, the integrated circuit 630 is placed inside one of the temporary bins 624a, 624b and 624c. The aforementioned steps are repeated until a whole batch of integrated circuits is tested and sorted.

The second signal 706 also controls the audio sensor 610 to monitor audio output from the testing computer 600 and sends back an audio signal 714 to the control device 640 so that test results of the integrated circuit are analyzed. The aforementioned testing method also permits the control device 640 to issue a temperature control signal 716 while executing a testing program. Hence, the operating temperature of the integrated circuit 630 is under control through the temperature control device 614 on the automatic plug/unplug tool 614 and/or the temperature control device 650 on the testing computer 600. Furthermore, the first signal 700 may be transmitted from the control device 640 to the preheating storage region 652 to preheat the integrated circuit 630 to a desired simulation temperature before driving the automatic transport device 620 to transfer the test integrated circuit 630 to testing computer 600. Note that a single image sensor 616 is capable of monitoring a group of testing computers 600. Obviously, it is also possible to install an image sensor in each testing computer station. In the testing process, not all test programs need to be conducted in parallel. For example, some integrated circuits 630 may require only the analysis of the monitored output image to determine the test results. For some other integrated circuits 630, the audio output needs to be monitored and analyzed as well. Yet, some other integrated circuits 630 such as audio integrated circuits may require the analysis of only the monitored audio output to determine the test results. In other words, the items to be tested can be selected or combined freely according to the actual requirement. In fact, any selected combination can be set up with ease through the testing system according to this invention.

The automatic integrated circuit full testing system and control method of this invention can also be applied to mass production. To increase productivity, multiple sets of testing computers 600 may be installed so that a multiple of integrated circuits are tested in parallel. Since the structure of each testing computer 600 is very similar to the one in the aforementioned description, details of its operation are omitted here. Note that the main host section may include a plurality of connectors for testing compatibility between different integrated circuits just like before. In other words, each testing computer may include different hardware. For example, the compatibility of a system bus controller towards several types of memories of different brands may be assessed by plugging memory of brand A into the first set of testing computer and memory of brand B into the second set of testing computer and so on. In addition, each testing computer may execute a different set of testing programs so that compatibility of the integrated circuit towards different application software can be assessed. For example, a first set of testing computer may execute standard DOS programs, a second set of testing computer may execute Windows programs and a third set of testing computer may execute the software program of a 3-D game and so on. Using the control device to control the automatic transport device, the integrated circuits 630 take turns to be tested in various testing computers (each having a different hardware installation and/or using different testing programs). Ultimately, performance of a given integrated circuit is fully investigated. The image sensor, on the other hand, may monitor the images produced by the entire set of testing computers or monitor the images of just a particular output device or peripheral device. For example, if a monitor is the target of the monitoring, images of the monitor are captured by a sensor and later compared with standard images. However, if a printer is the target of the monitoring, images of the printout are captured and compared with standard images.

Finally, if an industrial computer is the target of the monitoring, actions produced by a connected station are sensed.

In conclusion, the automatic integrated circuit full testing system, apparatus and performing method according to this invention includes the following major aspects and advantages:

1. A testing computer (having a main host section and major related peripheral devices) is joined with an integrated circuit to form a system-completed computer for conducting the testing. Hence, the method not only permits a simulation of end-uses states, but also permits the execution of an actual application software program such as a window operating system or a 3-D image playback so that quality of the integrated circuit can be assessed.

2. The automatic integrated circuit full testing system may include a plurality of integrated circuit connectors such as the connectors for a central processing unit, system bus controller, input/output bus controller or graphic accelerator on a testing computer. Hence, a single testing apparatus is capable of testing a number of integrated circuits. Furthermore, compatibility between different types of integrated circuits can also be assessed.

3. Through the automatic transport device, the integrated circuit supply rack, the integrated circuit binning device and the image sensors, the testing flow is fully automatic. Thus, productivity and testing accuracy is improved while production cost is lowered.

4. The automatic plug/unplug tool is capable of setting the temperature of integrated circuits so that operational testing with thermal stress environment can be conducted to obtain more detailed results.

5. Through the image sensors, this invention is able to monitor the dynamic states of the integrated circuits automatically. Since dynamic errors such as video shaking, discoloring display, ghost shadow, white block or errors in industrial computers are monitored, performance of the integrated circuit can be accurately assessed.

6. Through the scheduling operation of the control device, the integrated circuit may be sequentially tested using testing computers each having a different hardware structure or sequentially tested using testing computers each operating a different testing program (such as different application programs). Hence, compatibility of the integrated circuit with different types of hardware and software can be assessed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for controlling an automatic integrated circuit full testing system, said testing system comprising:

a plurality of testing computers each capable of carrying and testing an integrated circuit, wherein the testing computers with the integrated circuit inserted therein together form a system-completed computer for conducting a system-level test;

a plurality of automatic plug/unplug tools for engaging the integrated circuit with a corresponding testing computer and removing the integrated circuit therefrom;

an integrated circuit supply rack for holding the integrated circuit to be tested;

an integrated circuit binning device having a plurality of bins for holding tested integrated circuits;

an automatic transport device for fetching integrated circuits from the integrated circuit supply rack and transporting the integrated circuits to various testing computers as well as transporting the integrated circuits to the integrated circuit binning device;

at least one image sensor for capturing output images produced by the testing computer; and at least one control device electrically connected to the testing computers, the automatic transport devices, the automatic plug/unplug tools and the at least one image sensor;

wherein the automatic integrated circuit full testing control method comprises the steps of:

the control unit issues a first signal to drive the automatic transport device to fetch one test integrated circuit from the integrated circuit supply rack and to transport said integrated circuit to the corresponding testing computer;

the control unit issues a second signal to drive the automatic plug/unplug tools to electrically engage the integrated circuits with the corresponding testing computers to form the plurality of system-completed computers;

the control unit issues a third signal to drive the system-completed computers to each execute a preset testing program and issues a fourth signal to drive the image sensors so that output images of the system-completed computers are captured;

the control unit analyzes the test results and output images obtained from the system-completed computers to determine if the integrated circuits pass the testing; and the control unit issues a fifth signal to drive the automatic plug/unplug tools to remove the tested integrated circuit from the system-completed computers and issues a sixth signal to drive the automatic transport device so the tested integrated circuits are transported to corresponding bin within the integrated circuit binning device.

2. The control method of claim 1, wherein the automatic integrated circuit full testing system further comprises an audio sensor electrically connected to the control device for monitoring audio output of the system-completed computers and providing necessary information to the control device to analyze the test results.

3. The control method of claim 1, wherein the automatic integrated circuit full testing system further comprises a plurality of temperature control devices electrically connected to the control device and said method further comprises the step that said control device issues a signal to drive the temperature control devices to control the temperature of the test integrated circuits.

4. The control method of claim 1, wherein the automatic integrated circuit full testing system further comprises a preheating storage device and the integrated circuits is preheated to a preset temperature inside the preheat storage region before being transferred to the testing computer through the automatic transport device.

5. The control method of claim 1, wherein the test integrated circuit is tested on a first testing computer executing a first testing procedure and the test integrated circuit is then tested on a second testing computer executing a second testing procedure.

6. The control method of claim 1, wherein the test integrated circuit is tested on a first testing computer having a first hardware architecture and the test integrated circuit is then tested on a second testing computer having a second hardware architecture.

7. The control method of claim 1, wherein the control device is a computer capable of controlling the testing computers, the automatic plug/unplug, tools, the automatic transport devices, the image sensors as well as the testing flow.

8. An automatic integrated circuit full testing system, comprising:
   a control device capable of issuing a first signal, a second signal, a third signal, a fourth signal, a fifth signal and a sixth signal for controlling the testing flow of the automatic integrated circuit full testing system;
   an integrated circuit supply rack for holding a plurality of integrated circuits to be tested;
   an automatic transport device for transporting the integrated circuits and capable of receiving the third signal the first signal;
   a plurality of automatic plug/unplug tools electrically connected to the control device each capable of receiving the second signal;
   a plurality of testing computers electrically connected to the control device and capable of receiving the third signal, wherein the first signal chives the automatic transport device to transport the integrated circuits to respective testing computers, the second signal drives the automatic plug/unplug tools to plug the integrated circuits into respective testing computers so that the integrated circuits and the corresponding testing computers are electrically connected to form a plurality of system-completed computers, the system-completed computers receive the third signal to initiate the execution of a preset program and a set of resulting test signals are returned to the control device;
   at least one image sensor electrically connected to the control device and capable of receiving the fourth signal, wherein the image sensor monitors the output images produced by the system-completed computers and transmits the output image data to the control device; and
   an integrated circuit binning device having a plurality of storage bins for holding tested integrated circuits, wherein the control device receives the test result signals and the output images and conducts an analysis to determine if the integrated circuits pass the testing, the control device issues a fifth signal to drive the automatic plug/unplug tools so that the integrated circuits are removed from the system-completed computers, and a sixth signal drives the automatic transport device to transport the tested integrated circuits to corresponding storage bins according to the test results.

9. The testing system claim 8, wherein the testing system may further comprises a plurality of temperature control devices electrically connected to the control device to control the temperature of the test integrated circuits.

10. The testing system of claim 9, wherein the testing system further comprises a preheating storage region to preheat the integrated circuit before the integrated circuit is transported to the testing computer.

11. The testing system of claim 8, wherein the testing system comprises a first testing computer executing a first testing procedure and a second testing computer executing a second testing procedure.

12. The testing system of claim 8, wherein the testing system comprises a first testing computer having a first hardware architecture and a second testing computer having a second hardware architecture.

13. The testing system of claim 8, wherein the control device is a computer capable of controlling the testing computers, the automatic plug/unplug tools, the automatic transport devices, the image sensors as well as setting the testing flow.

14. A method of controlling an automatic integrated circuit full testing system, comprising the steps of:
   issuing a first signal from a control device to a plug/unplug tool for plugging an integrated circuit into a testing computer to form a system-completed computer;
   issuing a second signal from the control device to the testing computer for conducting at least one testing procedure;
   issuing a third signal from the control device to an image sensor for capturing image output from the testing computer; and
   issuing a fourth signal from the control device to the plug/unplug tool for removing the tested integrated circuit from the testing computer.

15. The control method of claim 14, wherein the method further comprises the step of:
   issuing a fifth signal from the control device to an audio sensor for capturing audio output from the testing computer.

16. The control method of claim 14, wherein the method further comprises the step of:
   issuing a sixth signal from the control device to a temperature control device connected to the control device for controlling the temperature of the integrated circuit.

17. The control method of claim 14, wherein the method further includes the step of:
   issuing a seventh signal from the control device to an automatic transport device to to fetch one test integrated circuit from a integrated circuit supply rack and to transport said integrated circuit to a corresponding testing computer.

18. The control method of claim 14, wherein the control device can conduct a system-level test of the integrated circuit in response to remote control signals issued from a remote terminal.

* * * * *